United States Patent
Yen et al.

[11] Patent Number: 6,004,622
[45] Date of Patent: *__Dec. 21, 1999__

[54] SPIN-ON-GLASS PROCESS WITH CONTROLLED ENVIRONMENT

[75] Inventors: Daniel L. W. Yen, Taipei; Been Yih Jin, Hsin Chu; Ming Hong Wang, Touliu, all of Taiwan

[73] Assignee: Macronix International Co., Ltd., Hsinchu, Taiwan

[ * ] Notice: This patent is subject to a terminal disclaimer.

[21] Appl. No.: 08/953,336

[22] Filed: Oct. 17, 1997

Related U.S. Application Data

[63] Continuation of application No. 08/557,010, filed as application No. PCT/US94/12785, Nov. 7, 1994, Pat. No. 5,716,673.

[51] Int. Cl.$^6$ ................................ B05D 3/12; B05D 3/04
[52] U.S. Cl. .................. 427/240; 427/335; 427/336; 438/760; 438/780; 438/782
[58] Field of Search ...................... 427/240, 335, 427/336; 118/52; 438/760, 780, 782, 948

[56] References Cited

U.S. PATENT DOCUMENTS

| | | | |
|---|---|---|---|
| 4,133,912 | 1/1979 | Stuart | 427/140 |
| 4,267,212 | 5/1981 | Sakawaki | 427/240 |
| 4,416,213 | 11/1983 | Sakiya | 118/52 |
| 4,741,926 | 5/1988 | White et al. | 427/240 |
| 4,806,504 | 2/1989 | Cleeves | 437/228 |
| 4,885,262 | 12/1989 | Ting et al. | 437/231 |
| 4,894,351 | 1/1990 | Batty | 437/190 |
| 4,941,426 | 7/1990 | Sago et al. | 118/52 |
| 4,996,080 | 2/1991 | Daraktchiev | 427/57 |
| 5,013,586 | 5/1991 | Cavazza | 427/240 |
| 5,127,362 | 7/1992 | Iwatsu et al. | 118/667 |
| 5,234,499 | 8/1993 | Sasaki et al. | 118/52 |
| 5,264,246 | 11/1993 | Ikeno | 427/240 |
| 5,366,757 | 11/1994 | Lin | 427/9 |

FOREIGN PATENT DOCUMENTS

| | | |
|---|---|---|
| 4203913 | 8/1993 | Germany . |
| 4203913 A1 | 8/1993 | Germany . |
| 63-198330 | 8/1988 | Japan . |

*Primary Examiner*—Shrive Beck
*Assistant Examiner*—Michael Barr
*Attorney, Agent, or Firm*—Haynes & Beffel LLP

[57] ABSTRACT

A process for spreading and flowing in a flowable dielectric during manufacture of an integrated circuit resulting in greater planarity and better gap filling ability. The process involves spinning the integrated circuit while controlling evaporation of the solvent from the flowable dielectric to increase the amount of flow in time and decrease spin velocity during flow in to improve planarity in gap filling ability. The process includes supporting the integrated circuit in a chamber; dispensing the flowable dielectric in a solvent on the integrated circuit in the chamber; covering the integrated circuit to provide a controllable environment within the chamber after the step of dispensing; spinning the integrated circuit while controlling the controllable environment to spread and flow in the flowable dielectric; uncovering the integrated circuit within the chamber; spinning the integrated circuit to spin off flowable dielectric; and curing the flowable the flowable dielectric.

18 Claims, 4 Drawing Sheets

SPIN-ON-GLASS PROCESS WITH CONTROLLED ENVIRONMENT

This application is a continuation of application Ser. No. 08/557,010, filed Dec. 1, 1995 U.S. Pat. No. 5,716,673, which is a 371 of PCT/US94/12785 filed Nov. 7, 1994.

BACKGROUND OF THE INVENTION

1. Field of the Invention

The present invention relates to planarization processes used during integrated circuit manufacturing; and more particularly to an improved spin-on-glass process in which the environment is controlled during the spread/flow-in step and other steps of the process.

2. Description of Related Art

Spin-on-glass (SOG) has been widely used in integrated circuit manufacturing to improve wafer surface planarity. A high degree of planarity on the wafer surface is needed for fine photolithographic resolution. Also, planarity is needed to avoid metal stringers after etching of the metal lines which might be left in impressions on the surface of the wafer and cause shorts on the device. Many articles have been published, for instance, in the annual VLSI Multilevel Interconnection Conferences, such as Ting, et al., "Planarization Process Using Spin-On-Glass", Proceedings Fourth International IEEE VLSI Multilevel Interconnection Conference, Jun. 15–16, 1987, pages 61–67. Also, background concerning the SOG coating principles can be found in Yonkoski, et al., "A Mathematical Model for Planarization of Microelectronic Topographies", Journal of the Electrochemical Society, Vol 141, No. 2, 1994, pages 585–593; and Sukanek, "A Model for Spin Coating with Topography", Journal of the Electrochemical Society, Vol. 136, No. 10, 1989, pages 3019–3026.

Many factors affect the results of a SOG coating profile. Properties of the materials used, including the surface tension, viscosity, solvent evaporation rate, and shrinkage due to high temperature curing are key factors in the ability of the SOG process to fill gaps and establish a planar surface. However, spin speed, SOG settling time, acceleration, the manner of dispensing the SOG, and the ambient during the coating process are important factors for establishing a quality coat on the device. There are many interacting factors involved in the SOG coating process including surface tension, SOG bulk viscosity, centrifugal force, and gravitational forces that the SOG experiences.

A conventional SOG coating process typically consists of the following steps:

1) Dispense SOG at a low wafer spin speed (e.g. 0–200 RPM).

2) Spread SOG at a medium spin speed to get uniform wafer coverage (e.g. 500–1000 RPM).

3) Flow-in (planarize) SOG at a slow speed (e.g. 500–1000 RPM).

4) Spin off the excess top layer SOG at a high speed (e.g. 2000–3000 RPM).

5) Transfer the wafer from the coater to a hot plate.

6) Bake/dry the SOG at higher temperatures.

There are several limitations to the conventional SOG coating process. First, there is a lower limit as to how slow the wafer may be spinned during the spread step, and a maximum amount of time during which the flow in step may be allowed to occur to avoid rapid viscosity changes due to loss of solvent. Further, the spin off rotation speed during the fourth step needs to be high enough to minimize excess SOG thickness on the top of wide metal structures. However, the spin off rotation speed cannot be too high such that unhardened SOG escapes filled in gaps in the underlying structure, leaving a void behind.

Further background concerning SOG coating process can be seen in U.S. Pat. No. 4,721,548 by Morimoto (SOG with etch back for semiconductor planarization); U.S. Pat. No. 4,775,550 by Chu, et al. (SOG with etch back for intermetal dielectric); U.S. Pat. No. 4,885,262 by Ting, et al. (chemically modified SOG); U.S. Pat. No. 5,003,062 by Yen (planarization process); U.S. Pat. No. 5,106,787 by Yen (high vacuum curing for SOG planarization).

Accordingly, it is desirable to provide a spin-on-glass process resulting in better filling of voids, better planarity, and thinner structures over wide metal features on the device.

SUMMARY OF THE INVENTION

The present invention provides an improved process for spreading and flowing in a flowable material on an irregular substrate, such as a flowable dielectric on an integrated circuit during manufacture, which results in greater planarity and better gap filling ability. The process involves spinning the irregular substrate while controlling evaporation of the solvent from the flowable material to increase the amount of flow-in time and decrease spin velocity during flow in to improve planarity and gap filling ability.

Thus, the invention can be characterized as a process for applying a flowable dielectric, such as spin-on-glass, during manufacturing of an integrated circuit. The process comprises supporting the integrated circuit in a chamber;

dispensing a solvent containing flowable dielectric on the integrated circuit in the chamber;

covering the integrated circuit to provide a controllable environment around the integrated circuit after the step of dispensing;

spinning the integrated circuit while controlling the controllable environment to spread and flow in the flowable dielectric;

uncovering the integrated circuit within the chamber;

spinning the integrated circuit to spin off flowable dielectric; and curing the flowable dielectric.

The environment surrounding the integrated circuit is controlled to slow down evaporation of the solvent, either passively by merely enclosing the integrated circuit during the spread and flow in process within a limited space, or actively, such as by controlling the vapor pressure of selected materials, controlling the temperature of the integrated circuit, or controlling other parameters of the environment.

The process according to the present invention allows the step of spinning the integrated circuit for the purpose of spreading and flowing in to be accomplished at a lower speed, such as at less than 500 RPM. Also, the process provides for allowing a longer spread and flow in time, such as greater than two seconds and up to thirty seconds or more. Furthermore, because of the better spreading and flowing in process, a higher speed for spinning off the spin-on-glass can be utilized, such as greater than 3000 RPM, resulting in a thinner dielectric over the wide metal areas on the device.

Because of the ability to control the wafer ambient with the moveable cap according to the present invention, even further engineering of the SOG process can be achieved. For instance, after the spread and flow in step, the cap may be opened and the integrated circuit exposed to the ambient, to allow the solvent to evaporate so that most of the solvent is removed. During exposure to the ambient, the integrated circuit may also be exposed to a bake or drying process to aid in removing the solvent from the deposited layer. After this step, the top layer of the SOG can be modified, such that a thin layer of it is made flowable. Then, a flow in process is executed again. These steps can be iterated to achieve ultimate planarity on the device. Finally, the excess top layer is spun off at high speed and the SOG is cured by baking and drying as before.

The top layer of the SOG can be modified according to the process described above by either introducing saturated vapor solvents into the ambient with the cap closed, or dispensing a liquid solvent directly onto the wafer surface. The solvent content of the modified top layer will be higher than the solvent content of deeper layers of the SOG. This will allow a very high spin off speed, such that the lower solvent content deeper layers will not be dislodged, while the top layers achieve very high planarity.

Thus, a new coating scheme in which one controls the wafer ambient environment, during the spread and flow in step, or any other step in which SOG characteristics can be controlled, is provided. By controlling the intrinsic environmental parameters, the surface profile of the spin-on-glass can be engineered as needed.

Other aspects and advantages of the present invention can be seen upon review of the figures, the detailed description in the claims which follow.

DETAILED DESCRIPTION OF PREFERRED EMBODIMENTS

Figure 1:
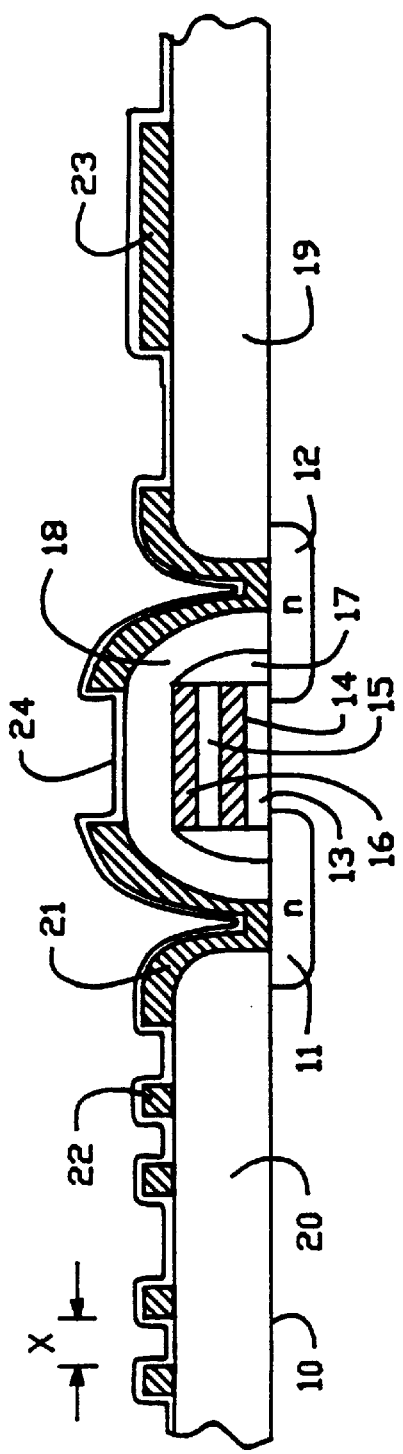
FIG. 1 is a schematic diagram of an integrated circuit structure on which a flowable dielectric may be applied.
Figure 2:
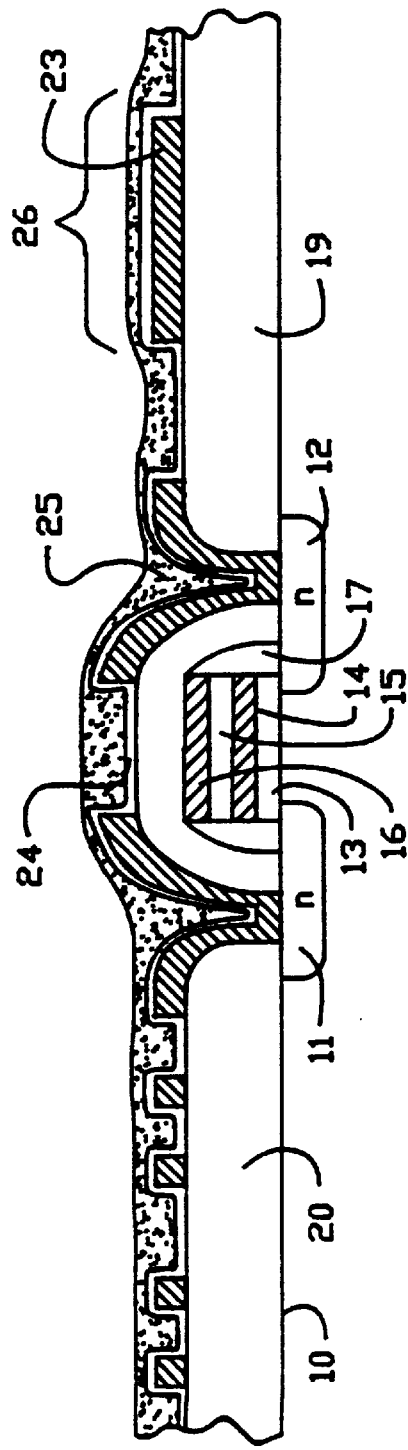
FIG. 2 is an illustration of the structure of FIG. 1 having the flowable dielectric thereon.
Figure 3:
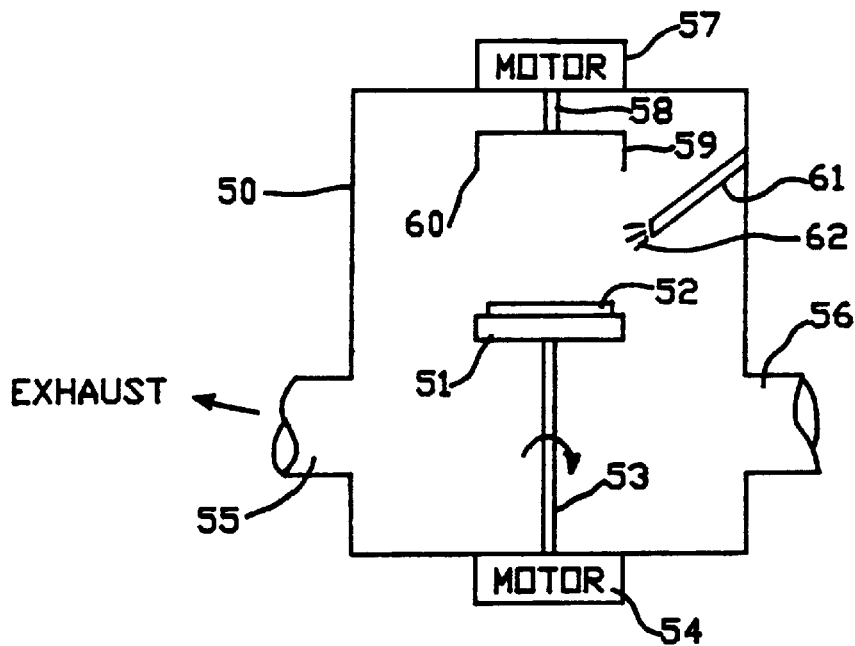
FIG. 3 is a conceptual diagram of the spin-on-glass coating chamber including a cover according the present invention.
Figure 4:
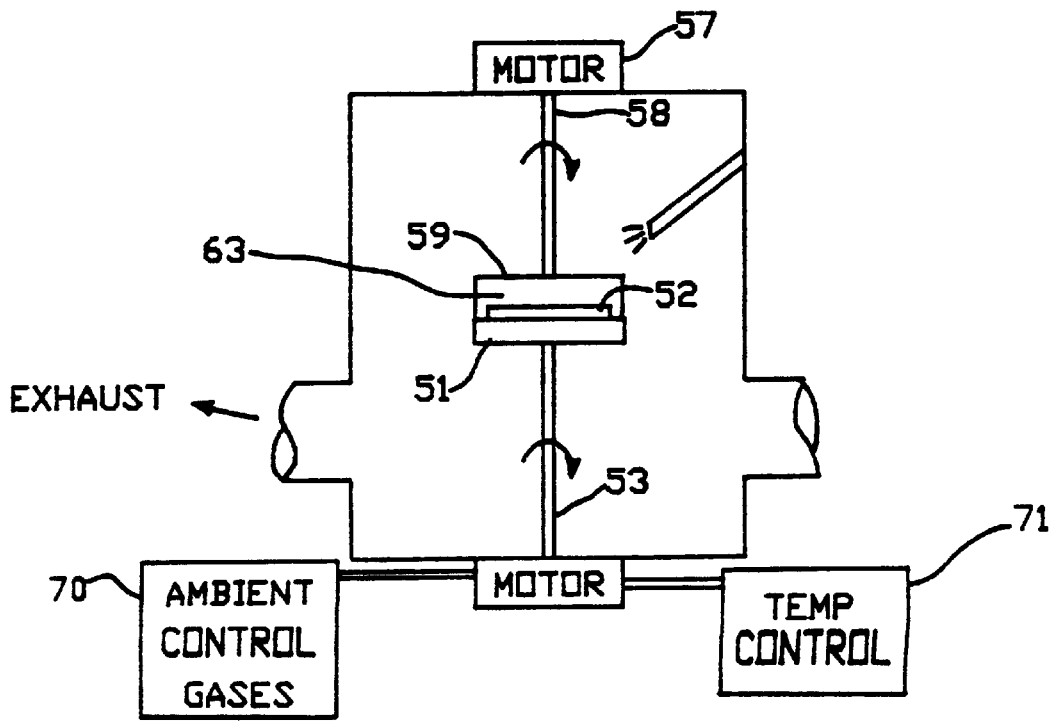
FIG. 4 illustrates the coating chamber of FIG. 3 having the cover closed over the integrated circuit and providing a controllable environment.
Figure 5:
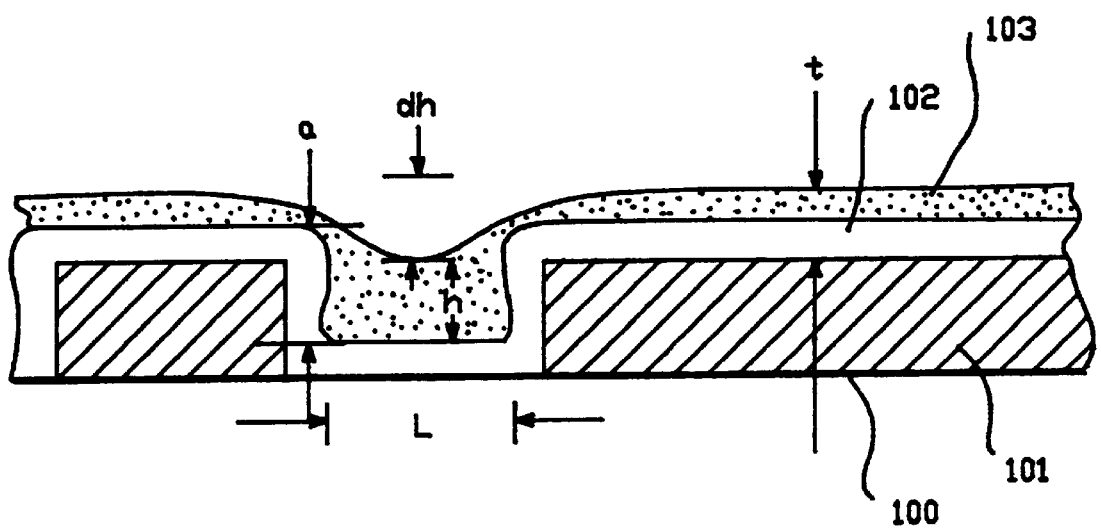
FIG. 5 is a schematic diagram of the flowable dielectric according to the present invention used to illustrate certain features of the invention.

The detailed description of the present invention is provided with respect to FIGS. 1–5, in which FIGS. 1 and 2 provide an example of a flowable dielectric according to the present invention, FIGS. 3 and 4 illustrate conceptually the equipment used to deposit the spin-on-glass layer, and FIG. 5 shows parameters of the resulting structure.

In FIG. 1, a cross sectional diagram of an integrated circuit structure is shown, where the line 10 represents the surface of an integrated circuit substrate, including for instance EPROM cells. An EPROM cell is formed therein having n-type buried diffusion regions 11 and 12 providing the source and drain for the memory cell. A thin insulator 13 is formed over the channel region of the EPROM device. A floating gate 14 is formed over the thin insulator 13. An insulator 15 is formed over the floating gate, and a control gate, or word line, polysilicon layer 16 is formed over the insulator 15. A side wall dielectric spacer 17 is formed on the side of the stack composed of the dielectric 13, the floating gate 14, the dielectric 15 and the control gate line 16. An insulating layer 18 is formed over the stack to isolate the polysilicon 16 from the metal layers following. This insulating layer also extends in the regions 19 and 20 to cover the semiconductor substrate. A metal contact 21 is formed in an opening established through the insulating material 18 down to the buried diffusion region 11. Also, metal lines 22 are patterned on the surface of the device for a variety of reasons. The device may have metal line spacings "X" on the order of six tenths of a micron. Also disposed on the integrated circuit over the dielectric 19 is a metal contact pad 23.

A high quality dielectric barrier 24 is formed over the underlying metal structures (21, 22, 23). The barrier dielectric 24 is formed of silicon oxynitride SiON or silicon nitride using a plasma enhanced CVD process.

The result of this process is a high quality barrier which blocks out moisture and mobile ions from reaching the underlying metal or other semiconductor structures.

After the growth of the high quality barrier dielectric 24, the opening over the metal contact 21 may be as narrow as 0.1 microns wide and 1.2 microns or more deep.

FIG. 2 illustrates the result of the SOG process of the present invention, as a next step in defining a passivation layer. According to the next step, a flowable dielectric layer 25 is deposited. This dielectric layer is laid down using a spin coat of flowable glass to fill the gaps between the metal lines and to smooth out the wafer surface. The flowable glass is then cured at about 420° C. to solidify the glass. The properties of the spin-on-glass SOG after curing are targeted as follows:

thickness (Angstroms): 2000 to 5500 refractive index: 1.3–1.4 gap fill: complete fill of 0.1 $\mu$m wide and >1.2 $\mu$m deep gaps.

planarity: >90% at large metal spacings (>40 $\mu$m metal spacing) SOG thickness on top of large metal pad (Angstroms): <1000 stress: 2 E8–7 E8 dynes/cm$^2$ tensile

Thus, the flowable dielectric fills depressions in the surface, such as the gaps between the metal lines and the dimples within the contact holes, and generally planarizes the underlying topography.

The spin-on-glass layer is not etch backed. Further it is applied using a process which minimizes the thickness of the spin on dielectric in the region generally 26 over the metal contact pad 23.

The spin-on-glass coating process consists of a dispense step, a spread step, and a dry setting step. In the dispense step, a controlled amount of flow glass is dispensed under optimized dispense arm movement and wafer rotation speeds. A moveable cap, making an enclosed compartment around the wafer, is then used to control the ambient above the wafer during the spin-spreading step. During the spreading step, the pressure, temperature, and ambient gas composition can be controlled within the enclosed compartment. Typically, a saturated vapor ambient is kept inside the enclosed compartment to keep the glass under a highly flowable state during spreading. The centrifugal force due to the wafer rotation assists in the global smoothing of the flow glass. A high speed rotation is needed at the end of the spreading step to spin off the excess flow glass and reduce the flow glass thickness on top of large metal pads. At the last dry setting step, the ambient is exhausted to dry and set the flow glass.

The base line recipe for the SOG coating process is as follows:

1. Dispense SOG: Time (sec): 0–2
   Spin Speed (rpm): 0–200
   Acceleration (rpm/s): 500–2000
   Exhaust (Ipm): 0–200
   Cup: open
2. Close Cap: Time (sec): 0–5
   Spin Speed (rpm): 0
   Acceleration (rpm/s): 2000–3000
   Exhaust (Ipm): 0–200
   Cup: closing
3. Spread/Flow-in: Time (sec): 0–30
   Spin Speed (rpm): 0–500
   Acceleration (rpm/s): 1000–3000
   Exhaust (Ipm): 0–200
   Cup: closed
4. Open Cap: Time (sec): 0–5
   Spin Speed (rpm): 0
   Acceleration (rpm/s): 2000–3000
   Exhaust (Ipm): 0–400
   Cup: opening
5. Spinoff: Time (sec): 0–20
   Spin Speed (rpm): 3000–5000
   Acceleration (rpm/s): 5000–10000
   Exhaust (Ipm): 0–400
   Cup: open Thus, the first step involves dispensing the SOG material such as commercially available siloxane polymer based materials, like Allied-Signal product numbers 512, 214 and 314. This step takes less than about 2 seconds with a final spin speed of less than about 200 revolutions per minute. The final spin speed is set rapidly with an acceleration rate of about 500–2000 rpm per second. Exhaust in the SOG chamber is set at less than about 200 liters per minute (Ipm) with the cap open.

After the dispense step, the cap is closed. This process takes up to 5 seconds. The spin speed is set with a rapid deceleration of 2000–3000 rpm per second to 0 rpm. The exhaust during the cap closing step is set at up to about 200 Ipm.

After the cap is closed, the SOG material is spread and flowed in. This process takes up to about 30 seconds, preferably greater than about 20 seconds, with a relatively low spin speed of up to about 500 rpm, preferably less than about 250 rpm. The spin speed is set with an acceleration rate of about 1000–3000 rpm per second with the exhaust in the outside chamber at a value up to about 200 lpm. During this process, the cap is closed, isolating the space inside the closed cap from the external exhaust, so that the evaporation rate of the SOG solvent is slowed down.

In the next step, the cap is opened. This step takes about up to 5 seconds with a 0 rpm spin speed. The spinning is stopped with a deceleration in a range of 2000–3000 rpm per second. The exhaust is set at a value of up to about 400 Ipm while the cap is being opened.

The final step is the spin off step which takes up to about 20 seconds. During spin off, the wafer rotates at a value between 3000–5000 rpm. The final spin speed is reached with rapid acceleration in the range of 5000–10000 rpm/s. The exhaust in the chamber is up to about 400 Ipm with the cap open.

This process allows much longer spread/flow-in time and a much lower spread/flow-in rotation speed compared to prior art systems, and achieves superior planarity, and accomplishes a thin SOG layer over the metal contact pads without an etch back step.

The equipment utilized to form the foregoing process steps is conceptually illustrated in FIGS. 3 and 4. Mechanically, this equipment can be implemented described for instance in German Patent Application No. DE 4203913, filed Feb. 11, 1992, invented by Gabriel, et aL, except modified for the smaller dimensions of a semiconductor wafer.

As shown in FIG. 3, the spin-on-glass equipment includes a spin-on-glass coating chamber, generally 50, which includes a support 51 for an integrated circuit 52. The support 51 is mounted on a shaft 53 which is coupled to a motor 54 for spinning the support 51. The chamber 50 is coupled through outlet 55 to an exhaust system. Inlet 56 may be used for such purposes as known in the art.

Also coupled to the chamber 50 is a motor 57 coupled to an extendable shaft 58 which supports a cover structure 59. The motor 57 and motor 54 are operated synchronously, such that the cover 59 and the support 51 may be spinned at the same rate. The periphery, generally 60, of the cover may comprise an elastic projection which is laid on the upward facing region of the support 51 or the integrated circuit wafer 52, as suits the needs of the particular application. Also, a mechanism 61 is provided for dispensing solvent containing spin-onglass material 62 on the integrated circuit 52.

FIG. 4 illustrates the chamber of FIG. 3 with the cover 59 lowered over the integrated circuit 52. The shaft 58 connecting the cover 59 to the motor 57 is extended so that the cover encloses the integrated circuit and establishes a controllable environment, generally 63, over the integrated circuit 52.

FIG. 4 also illustrates schematically that a source of ambient control gases, generally 70, may be coupled to the shaft 53 and supplied into the controllable environment 63 through the shaft 53 using techniques known in the art. Similarly, the temperature of the integrated circuit 52 may be controlled by a temperature control system, generally 71, which controls the temperature of the support member 51 during the spinning processes. Thus, the controllable environment 63 may be passively controlled by simply enclosing the integrated circuit during the spread and flow in spinning process. This will control the evaporation rate of the solvent used to carry the spin-on-glass during these steps. Alternatively, an active control system may be applied, in which the ambient control gases 70 are injected into the region 63 to control the vapor pressure of selected materials in the environment 63. Also, the temperature of the integrated circuit 52 may be controlled during these processes using temperature control systems 71. A combination of environmental controls might be applied to engineer the spin-on-glass material characteristics according to the need of the particular design.

FIG. 5 shows a structure including the spin-on-glass material of the present invention illustrate certain characteristics of the process. In FIG. 5, the integrated circuit substrate surface is shown at line 100. On the surface, a metal structure 101 is deposited. A CVD dielectric 102 is deposited over the metal structure 101. A spin-on-glass material 103 is deposited over the CVD dielectric 102.

The dimensions of the structure in FIG. 5 include the following:

h: SOG thickness in a wide open trench.

a: initial step height of the integrated circuit structure before SOG coating.

dh: a maximum height difference of the SOG coating on the integrated circuit.

L: the width of the trench prior to deposition of the SOG.

t: maximum thickness of the SOG on top of metal.

Adopting the definition of the degree of planarity (DOP) as described in the Yonkoski, et al. reference cited above, the degree of planarity is defined by the following equation:

$$DOP=(1-dh/a)\times 100\%$$

Figure 6:
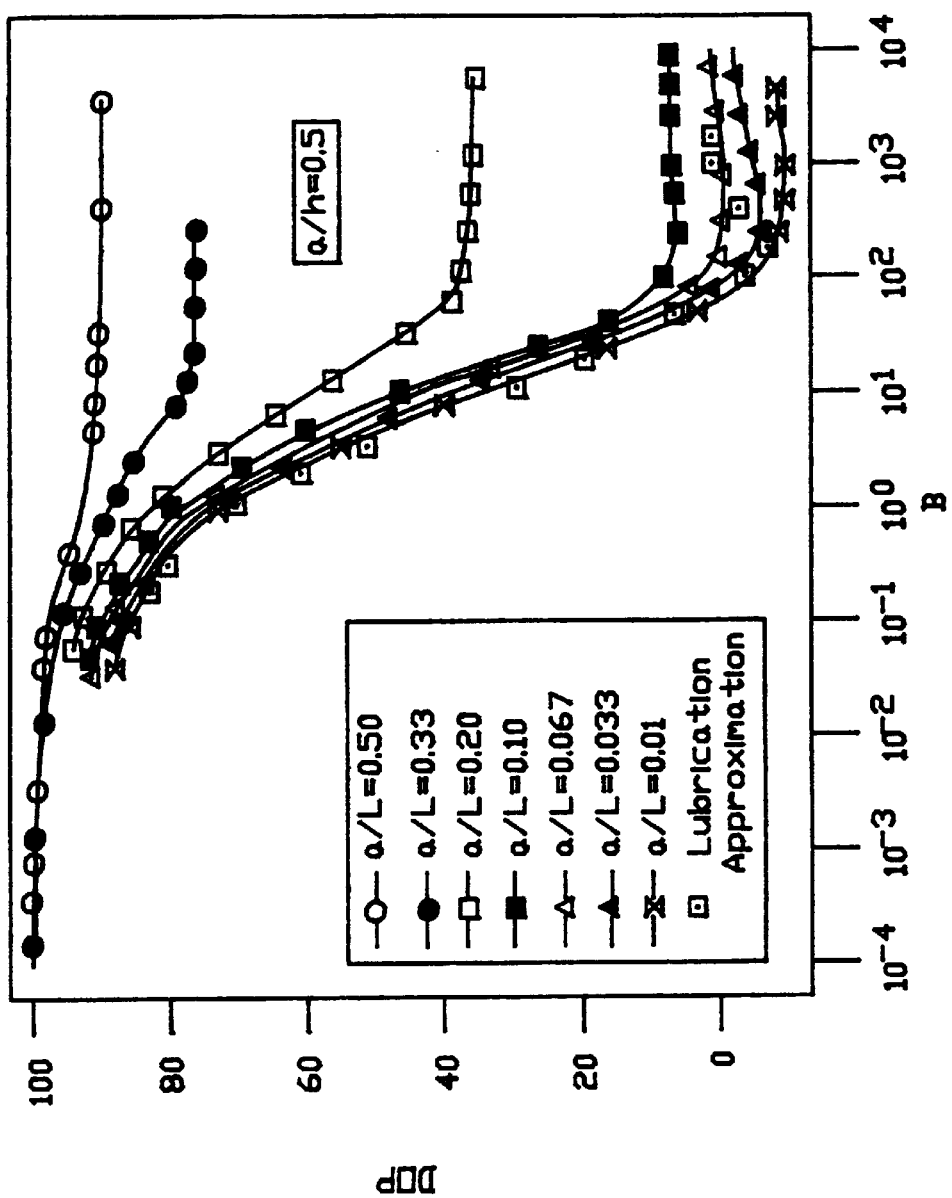
FIG. 6 is a graph illustrating parameters associated with the spin-on-glass process, taken from Yonkoski, et aL., cited above.

The DOP depends on the aspect ratio defined as a/L of the underlying gap or trench feature, and on the strength of the centrifugal and surface tension forces occurring during the SOG process. Thus, the DOP can be plotted as a function of the aspect ratio and a parameter B as in FIG. 6, where the parameter B is defined as the centrifugal force divided by the surface tension. In principle at small B, the lower the spin speed (a smaller centrifugal force) and higher surface tension of SOG will improve the DOP. The viscosity term is assumed constant and negligible in non-volatile fluid model such as illustrated in the Yonkoski, et al. reference. In reality, both viscosity and surface tension are continuously changing properties due to the evaporation of the solvent in the SOG during the spin coating process of the prior art. In some extreme cases, the SOG will solidify so fast that it will not flow to the edge of the wafers. These parameters are effectively controlled according to the present invention to achieve a high DOP and voidless filling of gaps, even with an aspect ratio in the range of 8 or higher for trenches with a width L on the order of 0.1 microns.

Further engineering of the SOG can be provided using the moveable cap which allows for selective control of the environment over the integrated circuit during selected spinning steps of the process. Thus, a process might be executed as follows:

1) dispense SOG,
2) enclose the wafer in a controlled environment where the SOG solvent loss will be minimized,
3) spread the SOG,
4) flow in the SOG,
5) exhaust the ambient, bake/dry the SOG so that the solvent is almost gone,
6) modify the top layer of the SOG, such that a thin layer of SOG is made flowable,
7) flow in the SOG as modified,
8) steps 5–7 may be iterated to achieve ultimate planarity,
9) spin off the excess top layer of SOG at high speed,
10) bake/dry the SOG for final curing.

The top layer of the SOG can be modified by introducing saturated vapor solvents into the closed cap ambient, or dispensing liquid solvent directly on the wafer surface before closing the cap for the step 7 flow in. This will create a graded solvent content profile across the thickness of the SOG such that the surface of the SOG has a higher solvent content than the deeper layers. This will allow a very high spin off speed, while preventing the SOG in deep features of the substrate from being dislodged. A fine shaping of the surface profile of the SOG may therefore be achieved.

The coating technique of the present invention results in better planarity and gap filling than prior art systems. The coating technique can be applied to areas other than flowable dielectrics in integrated circuits. In particular, the principle applies to any process that involves coating a volatile flowable material, and wherein the process results can be improved by controlling the ambient conditions.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A process for applying flowable dielectric during manufacture of an integrated circuit, comprising:
    supporting the integrated circuit in a chamber which encloses a chamber environment;
    dispensing the flowable dielectric in a solvent on the integrated circuit in the chamber;
    covering the integrated circuit to provide a controllable environment within and separated from the chamber environment after the step of dispensing;
    spinning the integrated circuit within the controllable environment to spread and flow in the flowable dielectric;
    uncovering the integrated circuit to expose the integrated circuit to the chamber environment within the chamber;
    spinning the integrated circuit to spin off excess flowable dielectric; and
    curing the flowable dielectric.

2. The process of claim 1, including during the step of spinning the integrated circuit within the controllable environment, slowing down evaporation of the solvent in the controllable environment.

3. The process of claim 1, including during the step of spinning the integrated circuit within the controllable environment, isolating the controllable environment from the chamber environment to prevent the solvent from escaping from the controllable environment.

4. The process of claim 1, including during the step of spinning the integrated circuit within the controllable environment, controlling vapor pressure in the controllable environment for selected materials.

5. The process of claims 1, including during the step of spinning the integrated circuit within the controllable environment, controlling temperature of the integrated circuit.

6. The process of claim 1, including during the step of spinning the integrated circuit within the controllable environment includes spinning the integrated circuit at less than 500 revolutions per minute.

7. The process of claim 1, including during the step of spinning the integrated circuit within the controllable environment includes spinning the integrated circuit at less than 250 revolutions per minute.

8. The process of claim 1, including during the step of spinning the integrated circuit within the controllable environment includes spinning the integrated circuit for longer than 2 seconds.

9. The process of claim 1, including during the step of spinning the integrated circuit within the controllable environment includes spinning the integrated circuit for longer than 20 seconds.

10. The process of claim 1, including during the step of spinning the integrated circuit within the controllable environment includes spinning the integrated circuit at less than 500 revolutions per minute for longer than 2 seconds.

11. The process of claim 1, wherein the step of spinning the integrated circuit to spin off excess flowable dielectric comprises spinning the integrated circuit at more than 3000 revolutions per minute.

12. A process for applying spin-on-glass during manufacture of an integrated circuit, comprising:

supporting the integrated circuit in a chamber which encloses a chamber environment;

dispensing a solvent containing spin-on-glass on the integrated circuit in the chamber environment;

covering the integrated circuit to provide a controllable environment within and separated from the chamber environment after the step of dispensing;

spinning the integrated circuit at less than 500 revolutions per minute for longer than 2 seconds within the controllable environment to spread and flow in the spin-on-glass;

uncovering the integrated circuit within the chamber to expose the integrated circuit to the chamber environment;

spinning the integrated circuit to spin off excess spin-on-glass; and curing the spin-on-glass.

13. The process of claim 12, wherein the spin-on-glass comprises a siloxane polymer.

14. The process of claim 12, including during the step of spinning the integrated circuit within the controllable environment includes slowing down evaporation of the solvent in the controllable environment.

15. The process of claim 12, including during the step of spinning the integrated circuit within the controllable environment, isolating the controllable environment from the chamber environment to prevent the solvent from escaping from the controllable environment.

16. The process of claim 12, including during the step of spinning the integrated circuit within the controllable environment, controlling vapor pressure in the controllable environment for selected materials.

17. The process of claim 12, including during the step of spinning the integrated circuit within the controllable environment, controlling temperature of the integrated circuit.

18. The process of claim 12, wherein the step of spinning the integrated circuit to spin off excess flowable dielectric comprises spinning the integrated circuit at more than 3000 revolutions per minute.

* * * * *